US012217991B2

(12) United States Patent
Chang et al.

(10) Patent No.: US 12,217,991 B2
(45) Date of Patent: Feb. 4, 2025

(54) PORTABLE ROBOTIC SEMICONDUCTOR POD LOADER

(71) Applicant: Taiwan Semiconductor Manufacturing Company Limited, Hsinchu (TW)

(72) Inventors: Chih-Kuo Chang, Hsinchu County (TW); Cheng-Lung Wu, Zhunan Township (TW); Ting-Yau Shiu, Taoyuan (TW); Wei-Chen Lee, Zhubei (TW); Yang-Ann Chu, Hsinchu (TW); Jiun-Rong Pai, Jhubei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 222 days.

(21) Appl. No.: 17/443,995

(22) Filed: Jul. 29, 2021

(65) Prior Publication Data

US 2023/0035556 A1 Feb. 2, 2023

(51) Int. Cl.
*H01L 21/677* (2006.01)
*B25J 9/16* (2006.01)
*B25J 19/02* (2006.01)

(52) U.S. Cl.
CPC ...... *H01L 21/67706* (2013.01); *B25J 9/1664* (2013.01); *B25J 9/1697* (2013.01); *B25J 19/021* (2013.01); *H01L 21/67727* (2013.01); *H01L 21/67733* (2013.01)

(58) Field of Classification Search
CPC ...... B25J 9/1664; B25J 9/1697; B25J 19/021; H01L 21/67727; H01L 21/67733; H01L 21/67772
See application file for complete search history.

(56) References Cited

U.S. PATENT DOCUMENTS 5,944,475 A * 8/1999 Bonora ............ H01L 21/67775 414/940
8,821,099 B2 9/2014 Hall et al.
2002/0099470 A1* 7/2002 Zinger ............. H01L 21/67757 700/228
2005/0008467 A1 1/2005 Huang et al.
2007/0207259 A1* 9/2007 Kulkarni .................. G03F 7/16 118/712

(Continued)

FOREIGN PATENT DOCUMENTS

CN 1576202 A 2/2005
CN 101511713 A 8/2009

(Continued)

*Primary Examiner* — Saul Rodriguez
*Assistant Examiner* — Brendan P Tighe
(74) *Attorney, Agent, or Firm* — Harrity & Harrity, LLP

(57) ABSTRACT

A portable robotic semiconductor pod loader may detect, with at least one sensor, receipt of a semiconductor pod on a load port of the portable robotic semiconductor pod loader. The at least one sensor is supported by the load port. The portable robotic semiconductor pod loader may cause a robot, of the portable robotic semiconductor pod loader, to align with the semiconductor pod provided on the load port. The portable robotic semiconductor pod loader may cause the robot to attach to the semiconductor pod, and may cause the robot to provide the semiconductor pod from the load port to a staging area of a semiconductor processing tool.

20 Claims, 13 Drawing Sheets

100
Overhead hoist transport (OHT) (115)
Semiconductor processing tool (110)
Front-opening universal pod (FOUP) (120)
Portable robotic semiconductor pod loader (105)

105
Monitor (155)
Range of motion for robot (165)
Top housing (130)
Robot (145)
Gripper (150)
Range of motion for gripper (170)
Load port (140)
Range of motion for load port (160)
Base housing (125)
Wheels (135)

(56) References Cited

U.S. PATENT DOCUMENTS

| | | | | |
|---|---|---|---|---|
| 2010/0040441 | A1* | 2/2010 | Obikane | H01L 21/67772 414/222.01 |
| 2010/0215461 | A1* | 8/2010 | Kamikawa | H01L 21/67769 414/222.13 |
| 2016/0035607 | A1* | 2/2016 | Lee | H01L 21/6773 414/808 |
| 2017/0025298 | A1* | 1/2017 | Iwamoto | B08B 5/00 |
| 2019/0257741 | A1* | 8/2019 | Griffith | G01N 21/8806 |
| 2020/0098611 | A1* | 3/2020 | Kuwahara | H01L 21/6773 |
| 2020/0242544 | A1* | 7/2020 | Galluzzo | B25J 9/1692 |
| 2022/0111529 | A1* | 4/2022 | Pehlivan | B25J 9/1694 |
| 2023/0010048 | A1* | 1/2023 | Fujishiro | H01L 21/67727 |

FOREIGN PATENT DOCUMENTS

| | | | | |
|---|---|---|---|---|
| CN | 114649250 | A | * | 6/2022 |
| KR | 20220072236 | A | * | 6/2022 |
| TW | 201925054 | A | | 7/2019 |

* cited by examiner

220
Move the robot along the x-axis to align with the FOUP provided on the load port

230

Move the robot along the y-axis to align the robot above the FOUP provided on the load port, move the robot along the z-axis to provide the gripper and the gripper portion around the FOUP, and affix the gripper portion to the FOUP 235
Move the robot upward along the z-axis, after attaching the gripper to the FOUP, to move the FOUP upward away from the load port 240
Rotate the robot to cause an opening of the FOUP to face the semiconductor processing tool and move the robot along the y-axis toward a staging area of the semiconductor processing tool 245
Move the robot downward along the z-axis to place the FOUP onto the staging area of the semiconductor processing tool Cause the robot to release the FOUP and move the robot along the y-axis and away from the semiconductor processing tool

PORTABLE ROBOTIC SEMICONDUCTOR POD LOADER

BACKGROUND

A front opening universal (or unified) pod (FOUP) is a specialized plastic enclosure designed to hold semiconductor devices (e.g., wafers, dies, and/or the like) securely and safely in a controlled environment, and to allow the semiconductor devices to be transferred between semiconductor processing equipment.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
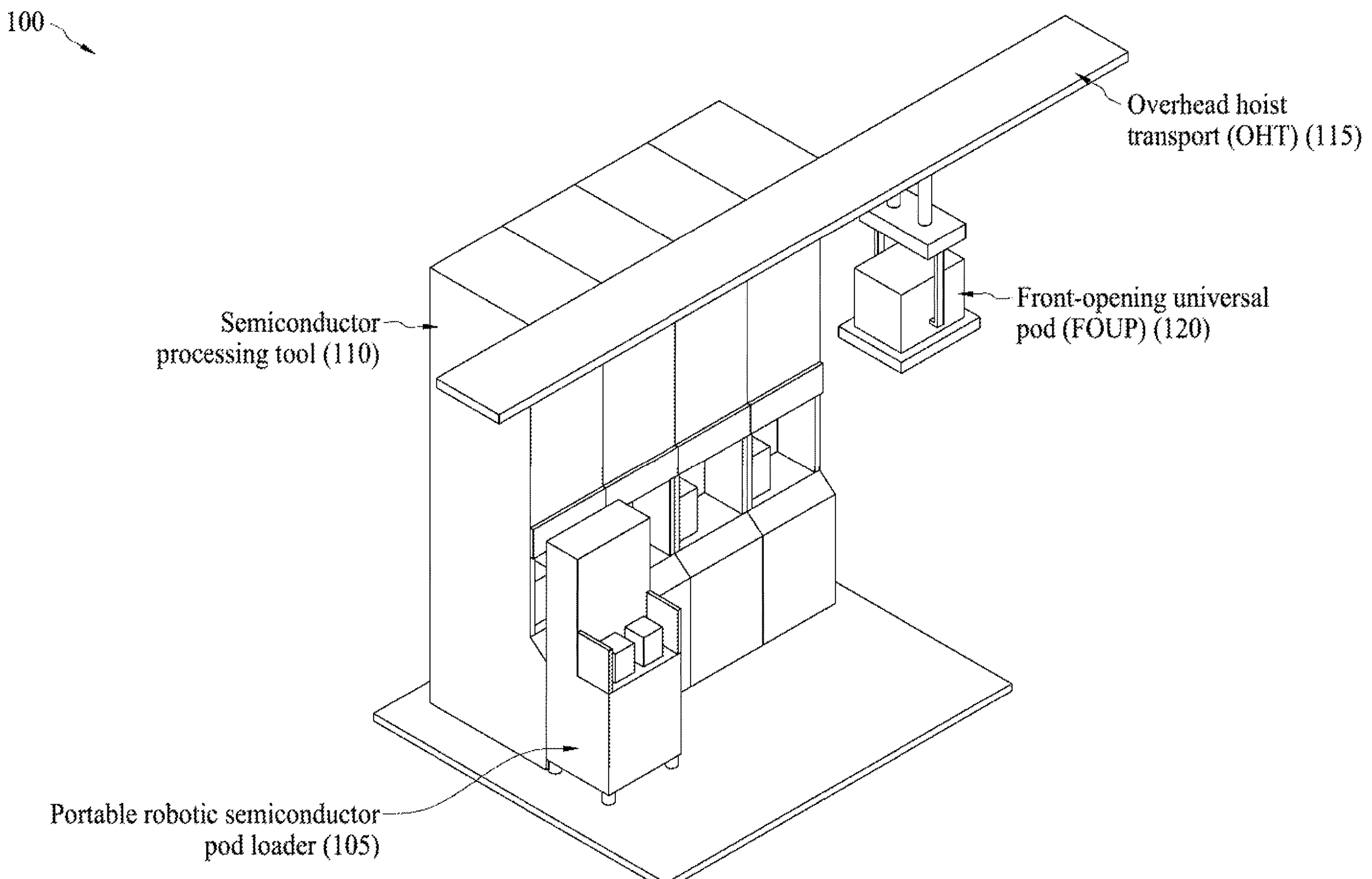
FIGS. 1A-1D are diagrams of an environment that includes a portable robotic semiconductor pod loader described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some instances, a FOUP may include fins that hold semiconductor devices in place, and a front opening door to allow robotic handling mechanisms to access the semiconductor devices directly from the FOUP. An automated material handling system (AMHS) may be utilized to transport the FOUP between semiconductor processing tools. The FOUP may include various coupling plates, pins, holes, and/or the like to allow the FOUP to be transported between and provided to different semiconductor processing tools. An identification tag (e.g., a radio frequency tag) may be attached to the FOUP to enable the semiconductor processing tools, the AMHS, and/or the like to identify the FOUP and semiconductor devices stored in the FOUP. However, the process of loading and unloading a FOUP to and from an entrance or staging area of a semiconductor processing tool may be a manual process that is performed by a human operator. This can cause interruptions in the process flow of the semiconductor processing tool, which can prevent continuous operation of the semiconductor processing tool. Furthermore, an overhead AMHS may be prevented from providing a FOUP to the staging area of the semiconductor processing tool due to a configuration (e.g., a top cover) of the semiconductor processing tool.

According to some implementations described herein, a portable robotic semiconductor pod loader may be utilized to automatically load and unload a FOUP to and from an entrance or staging area of a semiconductor processing tool, without a human operator. For example, a portable robotic semiconductor pod loader may include a base housing, and a top housing provided above and supported by the base housing. The portable robotic semiconductor pod may include a load port supported by the base housing, wherein the load port may receive a semiconductor pod from an overhead automated material handling system. At least one sensor may be supported by the load port, and the at least one sensor may detect a presence or placement of the semiconductor pod on the load port. The portable robotic semiconductor pod may include a robot supported by the top housing, wherein the robot may provide the semiconductor pod from the load port to a staging area of a semiconductor processing tool.

In this way, the portable robotic semiconductor pod loader may automatically load and unload FOUPs to and from staging areas of semiconductor processing tools. For example, the portable robotic semiconductor pod loader may receive a FOUP from an AMHS, may orient the FOUP, and may provide the FOUP to a staging area of a semiconductor processing tool. Thus, the portable robotic semiconductor pod loader may prevent manual loading and unloading of FOUPs at staging areas of semiconductor processing tools, which may prevent interruptions in the process flow of the semiconductor processing tools and may improve the efficiency of processing semiconductor devices by the semiconductor processing tools. Furthermore, the portable robotic semiconductor pod loader may receive the FOUP from an overhead AMHS, and may provide the FOUP to the staging area of the semiconductor processing tool.

FIGS. 1A-1D are diagrams of an environment 100 that includes a portable robotic semiconductor pod loader 105 described herein. As shown in FIG. 1A, portable robotic semiconductor pod loader 105 may be utilized with a semiconductor processing tool 110 and an overhead hoist transport (OHT) 115 that transports FOUPs 120 to portable robotic semiconductor pod loader 105.

Portable robotic semiconductor pod loader 105 may include a portable device that receives FOUP 120 from OHT 115 and provides FOUP 120 to semiconductor processing tool 110; receives FOUP 120 from semiconductor processing tool 110 and provides FOUP 120 to OHT 115; and/or the like. In some implementations, a width of portable semiconductor pod loader 105 is approximately greater than or equal to a width of semiconductor processing tool 110 to enable a robot (e.g., described below) of portable semiconductor pod loader 105 to manipulate FOUP 120 and provide FOUP 120 from portable semiconductor pod loader 105 to semiconductor processing tool 110. Further details of portable robotic semiconductor pod loader 105 are provided below in connection with FIGS. 1B-2G.

Semiconductor processing tool 110 may include a tool utilized to process semiconductor devices, such as a pre-clean tool, a deposition tool, an annealing tool, a photoresist tool, an etch tool, and/or the like. Portable robotic semiconductor pod loader 105, semiconductor processing tool 110, and OHT 115 may be included in a semiconductor clean room, a semiconductor foundry, a semiconductor processing and/or manufacturing facility, and/or the like.

OHT 115 may include a robot arm, a tram or rail car, and/or another type of device that is used to transport semiconductor devices between semiconductor processing tools 110 and/or to and from other locations, such as a rack, a storage room, and/or the like. In some implementations, OHT 115 may be a programmed device to travel a particular path and/or may operate semi-autonomously or autonomously. OHT 115 may include an automated material handling system (AMES) that travels on an overhead track and accesses a load port of a stocker or semiconductor processing tool 110 via a belt driven hoisting mechanism.

FOUP 120 is a semiconductor pod designed to hold semiconductor devices securely and safely in a controlled environment, and to allow the semiconductor devices to be transferred between semiconductor processing tools 110. FOUP 120 may include mechanisms (e.g., fins) that hold semiconductor devices in place, and a front opening door to allow robotic handling mechanisms to access the semiconductor devices directly from FOUP 120. OHT 115 may be utilized to transport FOUP 120 between semiconductor processing tools 110. FOUP 120 may include various mechanisms (e.g., coupling plates, pins, holes, and/or the like) to allow FOUP 120 to be transported between and provided to different semiconductor processing tools 110. An identification tag (e.g., a radio frequency tag) may be attached to FOUP 120 to enable portable robotic semiconductor pod loader 105, semiconductor processing tools 110, OHT 115, and/or the like to identify FOUP 120 and semiconductor devices stored in FOUP 120. In some implementations, the structure of FOUP 120 may be box shaped with a front opening to receive semiconductor devices and/or to remove semiconductor devices from FOUP 120. FOUP 120 may be constructed of a material (e.g., plastic, steel, and/or the like) that is rigid enough to support semiconductor devices. Although FOUP 120 is shown in FIG. 1A as having a box shape (e.g., a rectangular box shape), in some implementations, FOUP 120 may have a different shape.

Figure 1B:
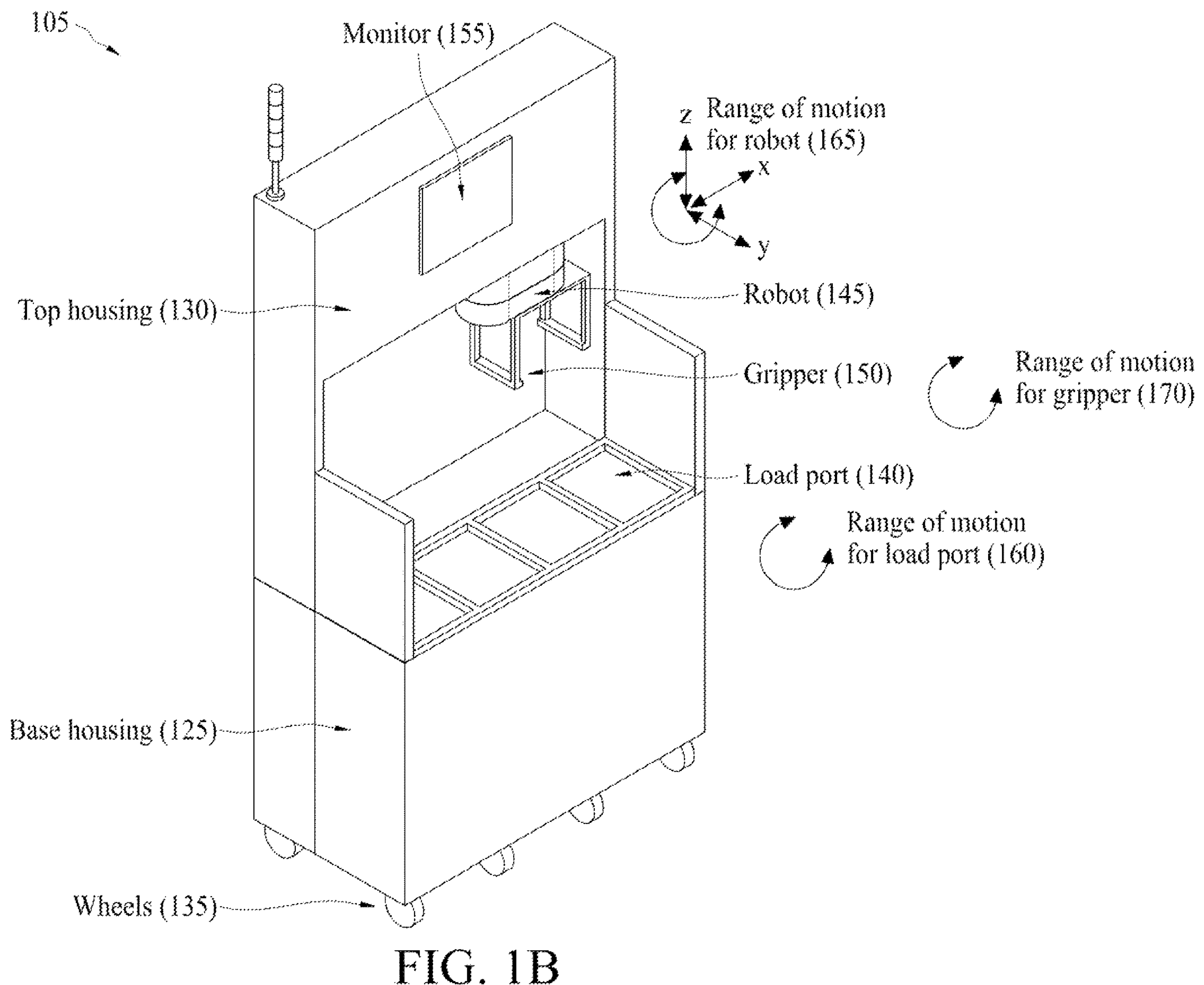

As shown in FIG. 1B, portable robotic semiconductor pod loader 105 may include a base housing 125, a top housing 130, wheels 135, one or more load ports 140, a robot 145, a gripper 150, and a monitor 155.

Base housing 125 includes a structure that supports top housing 130 and/or load ports 140. For example, base housing 125 may be sized and shaped to support multiple load ports 140 and to enable robot 145 to move to and from multiple load ports 140. In some implementations, base housing 125 is integrally formed with top housing 130 as a single housing for portable robotic semiconductor pod loader 105. Base housing 125 may be constructed of a material or materials that are rigid enough to support weights of one or more FOUPs 120, top housing 130, one or more load ports 140, robot 145, gripper 150, monitor 155, and/or the like. For example, base housing 125 may be constructed of steel, aluminum, alloy, plastic, and/or the like.

Top housing 130 includes a structure that supports robot 145, gripper 150, and/or monitor 155. For example, top housing 130 may be sized and shaped to enable robot 145 and gripper 150 to move to and from multiple load ports 140, to and from semiconductor processing tool 110, and/or the like. Top housing 130 may be constructed of a material or materials that are rigid enough to support weights of robot 145, gripper 150, monitor 155, and/or the like. For example, top housing 130 may be constructed of steel, aluminum, alloy, plastic, and/or the like.

Wheel 135 includes an undriven, single, double, rotatable, compound, and/or the like caster (or castor) wheel that is designed to be attached to a bottom of base housing 125 to enable base housing 125 to be moved in all directions. Wheel 135 may include various sizes depending on a size and a weight of portable robotic semiconductor pod loader 105, and may be made of rubber, plastic, nylon, aluminum, stainless steel, and/or the like. A quantity of wheels 135 may be attached to the bottom of base housing 125 based on the size and the weight of portable robotic semiconductor pod loader 105. For example, the quantity of wheels 135 associated with portable robotic semiconductor pod loader 105 that is large and/or heavy may be greater than the quantity of wheels 135 associated with portable robotic semiconductor pod loader 105 that is smaller and/or less heavy. In some implementations, wheels 135 may be powered (e.g., by a motor) so that portable robotic semiconductor pod loader 105 may move autonomously or semi-autonomously between semiconductor processing tools 110.

Load port 140 includes a platform to support different sized FOUPs 120. For example, load port 140 may be sized and shaped to support the different sized FOUPs 120 and may include a base plate, one or more guides, one or more sensors, and/or the like. Load port 140 may be constructed of a material or materials that are rigid enough to support weights of the different sized FOUPs 120. For example, load port 140 may be constructed of steel, aluminum, alloy, plastic, and/or the like. Further details of load port 140 are provided below in connection with one or more of FIGS. 1C and 1D.

Robot 145 includes a robotic device that provides FOUPs 120 from load ports 140 to a staging area of semiconductor processing tool 110, that provides FOUPs 120 from the staging area of semiconductor processing tool 110 to load ports 140, that provided FOUPs 120 from one load port 140 to another load port 140, and/or the like. Robot 145 may include gripper 150 to grip FOUPs 120 so that FOUPs 120 may be manipulated. In some implementations, a portion of gripper 150 includes a thickness of less than approximately five millimeters, to enable the portion of gripper 150 to connect with one or more grooves provided in FOUP 120 (e.g., so that FOUP 120 may be gripped). Robot 145 may include a main body and a track (e.g., a belt conveyor system, a sliding rack, or similar mechanism) to allow robot 145 to move along an x-axis (e.g., an axis parallel to a width of portable robotic semiconductor pod loader 105). Robot 145 may include an articulating robotic arm to rotate FOUP 120 and to move gripper along a y-axis (e.g., an axis parallel to a depth of portable robotic semiconductor pod loader 105). Robot 145 may further include a ball screw or similar mechanism to raise and lower robot 145 and gripper 150 along a z-axis (e.g., an axis parallel to a height of portable robotic semiconductor pod loader 105).

Monitor 155 may include a display device, such as a touch screen display, that provides information to an operator of portable robotic semiconductor pod loader 105 about operation of portable robotic semiconductor pod loader 105, FOUPs 120 provided on load ports 140, placement of FOUPs 120 on load ports 140, and/or the like.

As further shown in FIG. 1B, and by reference number 160, load port 140 may include a rotational range of motion to enable load port 140 to rotate FOUP 120 so that the front opening of FOUP 120 is facing an entrance to semiconductor processing tool 110. As further shown in FIG. 1B, and by reference number 165, robot 145 may include a rotational range of motion to enable robot 145 to rotate FOUP 120 so that the front opening of FOUP 120 is facing the entrance to semiconductor processing tool 110; a range of motion along the x-axis so that robot 145 may move to different load ports 140; a range of motion along the y-axis so that robot 145 may move FOUP 120 from load port 140 to the staging area of semiconductor processing tool 110 or from the staging area of semiconductor processing tool 110 to load port 140; and/or a range of motion along the z-axis so that robot 145 may move up away from load port 140 or down toward load port 140. As further shown in FIG. 1B, and by reference number 170, gripper 150 may include a rotational range of motion to enable gripper 150 to rotate FOUP 120 so that the front opening of FOUP 120 is facing the entrance to semiconductor processing tool 110. In some implementations, any one of or all of load port 140, robot 145, or gripper 150 may be configured to rotate FOUP 120 so that the front opening of FOUP 120 is facing the entrance to semiconductor processing tool 110.

Figure 1C:
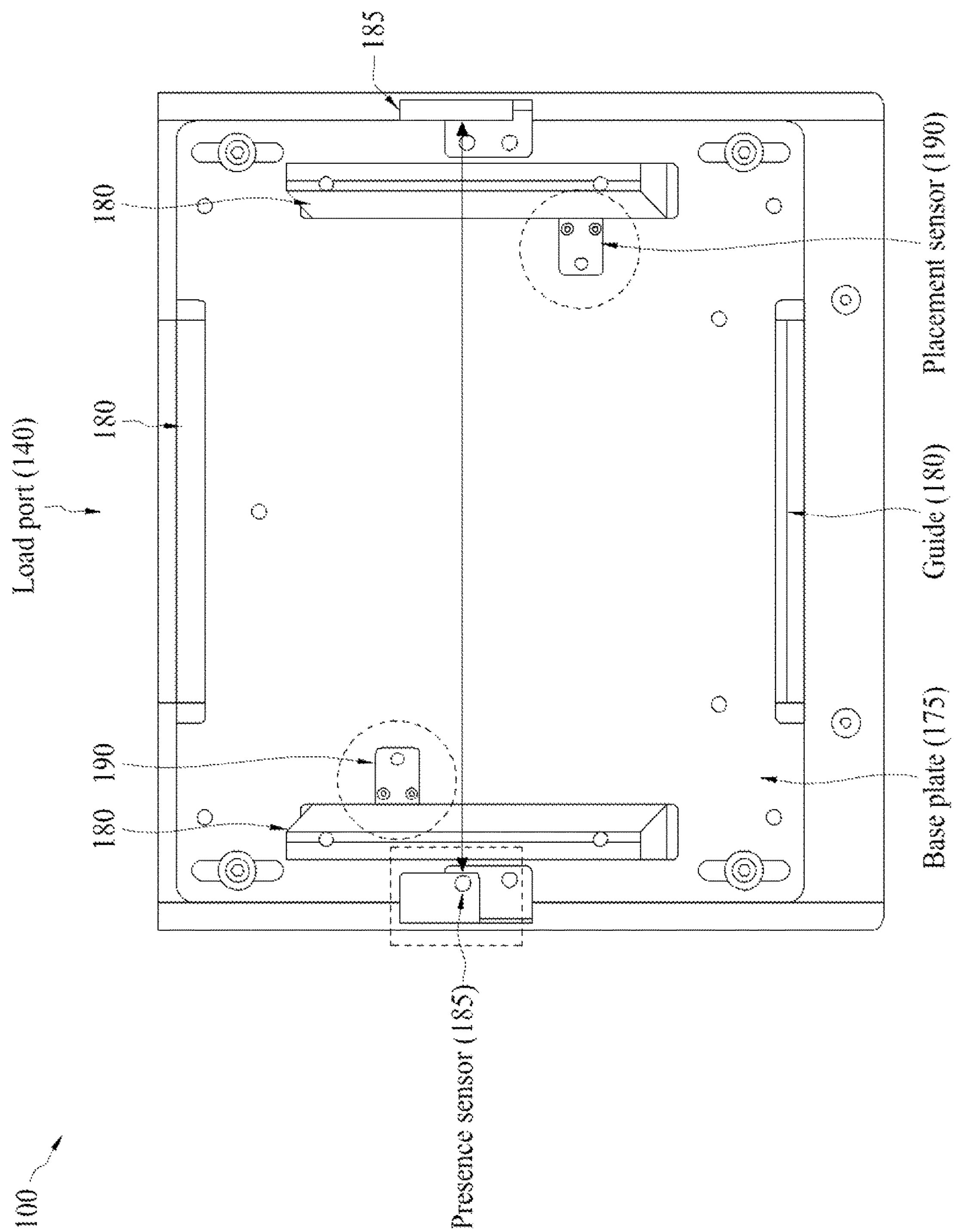

As shown in FIG. 1C, an example of load port 140 may include a base plate 175, one or more guides 180 attached to a top surface of base plate 175, one or more presence sensors 185 attached to the top surface of base plate 175, and one or more placement sensors 190 attached to the top surface of base plate 175.

Base plate 175 includes a platform to support different sized FOUPs 120. For example, base plate 175 may be sized and shaped (e.g., rectangular, square, circular, and/or the like) to support the different sized FOUPs 120. Base plate 175 may be constructed of a material or materials that are rigid enough to support weights of the different sized FOUPs 120. For example, base plate 175 may be constructed of steel, aluminum, alloy, plastic, and/or the like.

The one or more guides 180 may be utilized for positioning FOUP 120 on base plate 175. Guides 180 may be sized and shape to contact one or more sides of FOUP 120 when FOUP 120 is rectangular shaped, square shaped, and/or the like. Guides 180 may be constructed of a material (e.g., plastic, steel, rubber, and/or the like) that is rigid enough to position FOUP 120 on base plate 175. As shown in FIG. 1C, base plate 175 may include four guides 180 that correspond to four sides of FOUP 120. Guides 180 may orient FOUP 120 on base plate 175 so that gripper 150 of robot 145 may more easily attach to and manipulate FOUP 120.

Presence sensor 185 may include an optical sensor (or another type of sensor) that identifies and detects a presence of FOUP 120 on base plate 175. In some implementations, detecting the presence of FOUP 120 may cause presence sensor 185 to generate a signal indicating to portable robotic semiconductor pod loader 105 (e.g., a processor of portable robotic semiconductor pod loader 105) that FOUP 120 is provided on base plate 175. In this way, portable robotic semiconductor pod loader 105 may determine that FOUP 120 is available to be manipulated by portable robotic semiconductor pod loader 105. A signal from presence sensor 185, a signal from placement sensor 190, or a combination thereof may be used to indicate that FOUP 120 is provided on base plate 175. For example, when the signal from presence sensor 185 indicates the presence of FOUP 120 on base plate 175 and/or when the signal from placement sensor 190 indicates a correctly positioned FOUP 120, robot 145 may be enabled for use to manipulate FOUP 120 (e.g., to provide FOUP 120 from load port 140 to the staging area of semiconductor processing tool 110). As further shown in FIG. 1C, two presence sensors 185 may be provided at opposing sides of base plate 175 to detect the presence of FOUP 120 on base plate 175. In some implementations, fewer presence sensors 185, additional presence sensors 185, differently arranged presence sensors 185, and/or the like may be provided on base plate 175.

Placement sensor 190 may include a pressure sensor (e.g., a mechanical sensor) that identifies and detects a position of FOUP 120 on base plate 175. In some implementations, detecting the position of FOUP 120 may cause placement sensor 190 to generate a signal indicating to portable robotic semiconductor pod loader 105 (e.g., a processor of portable robotic semiconductor pod loader 105) that FOUP 120 is correctly positioned on base plate 175. If FOUP 120 is incorrectly positioned on base plate 175, placement sensor 190 may provide, to portable robotic semiconductor pod loader 105, one or more placement sensors 190 may not generate a signal, which may indicate that FOUP 120 is incorrectly positioned on base plate 175. In this way, portable robotic semiconductor pod loader 105 may provide (e.g., to robot 145 or to an operator of portable robotic semiconductor pod loader 105 via monitor 155) a notification indicating that FOUP 120 is incorrectly positioned on base plate 175 (e.g., so that robot 145 or the operator may correct the position of FOUP 120 on base plate 175). As further shown in FIG. 1C, two placement sensors 190 may be provided inside two guides 180 to detect the position of FOUP 120 on base plate 175. In some implementations, fewer placement sensors 190, additional placement sensors 190, differently arranged placement sensors 190, and/or the like may be provided on base plate 175.

Figure 1D:
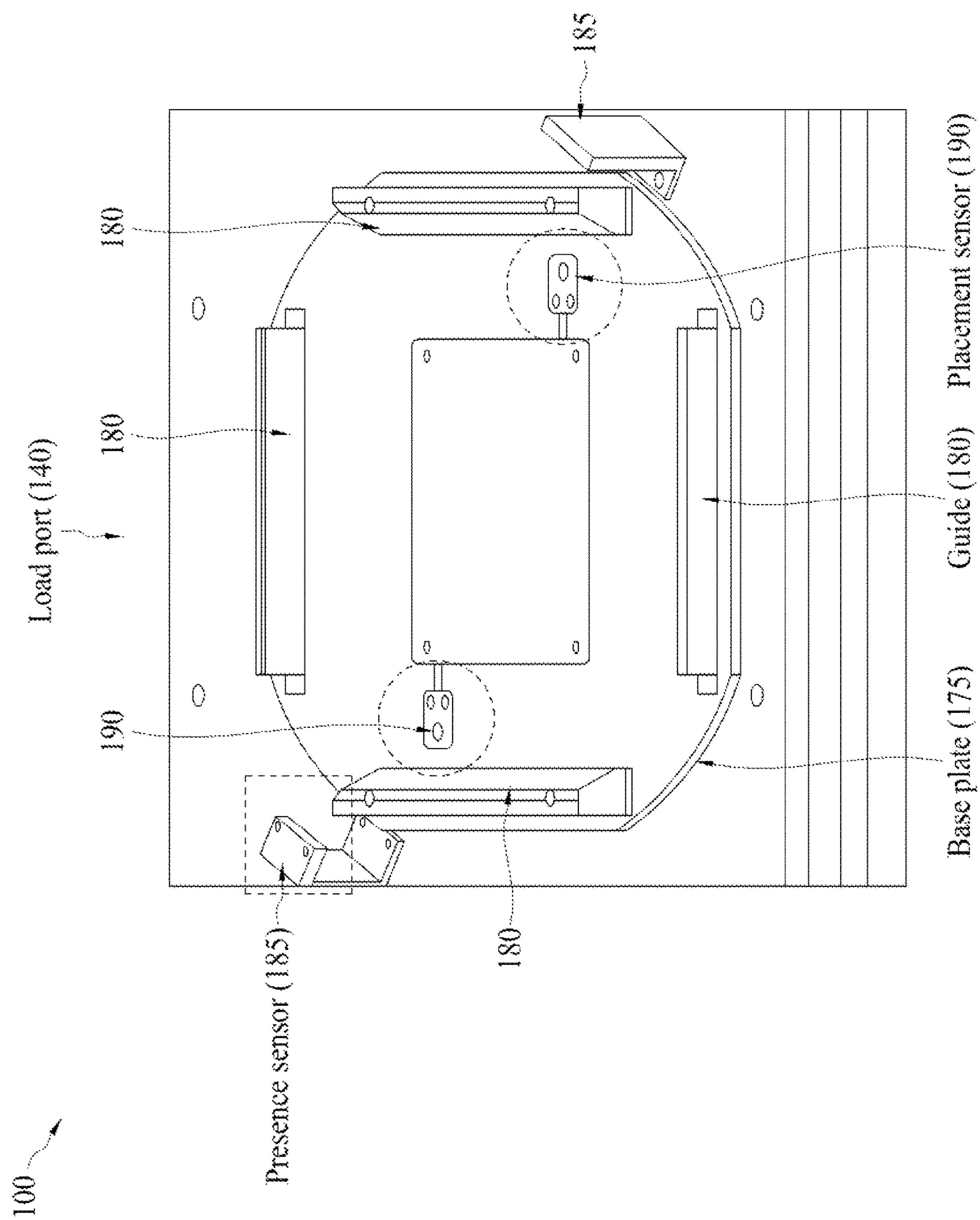

As shown in FIG. 1D, another example of load port 140 may include base plate 175, one or more guides 180 attached to the top surface of base plate 175, one or more presence sensors 185 attached to the top surface of base plate 175, and one or more placement sensors 190 attached to the top surface of base plate 175. Base plate 175, guides 180, presence sensors 185, and placement sensors 190 may include the features described above in connection with FIG. 1C. As further shown in FIG. 1D, two presence sensors 185 may be provided near opposing corners of base plate 175 to detect the presence of FOUP 120 on base plate 175. In some implementations, fewer presence sensors 185, additional presence sensors 185, differently arranged presence sensors 185, and/or the like may be provided on base plate 175. As further shown in FIG. 1D, two placement sensors 190 may be provided inside two guides 180 to detect the position of FOUP 120 on base plate 175. In some implementations, fewer placement sensors 190, additional placement sensors 190, differently arranged placement sensors 190, and/or the like may be provided on base plate 175. For example, portable robotic semiconductor pod loader 105 may include all of the same type of load ports 140 (e.g., to accommodate a certain sized and/or shaped FOUP 120) or different types of load ports 140 (e.g., to accommodate different sized and/or shaped FOUPs 120).

As indicated above, FIGS. 1A-1D are provided merely as one or more examples. Other examples may differ from what is described with regard to FIGS. 1A-1D.

Figure 2A:
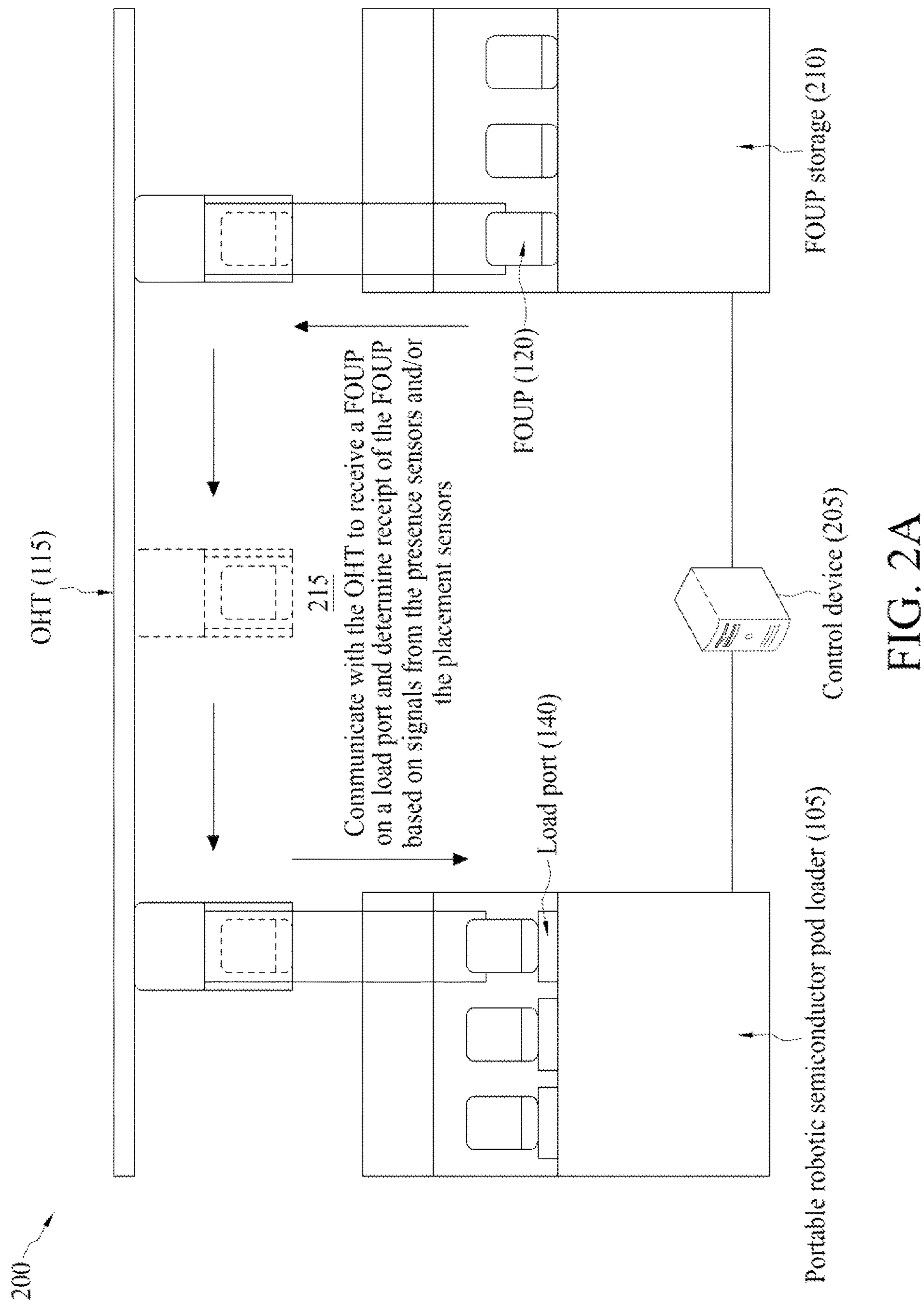
FIGS. 2A-2G are diagrams of operation of portable robotic semiconductor pod loader described herein.

FIGS. 2A-2G are diagrams 200 of operation of portable robotic semiconductor pod loader 105 described herein. As shown in FIG. 2A, a control device 205 may be associated with portable robotic semiconductor pod loader 105, OHT 115, and a FOUP storage 210. Control device 205 may include a computing device (e.g., a service device, a cloud computing device, a desktop computer, and/or the like) to control transport of FOUPs 120 to and/or from portable robotic semiconductor pod loader 105, semiconductor processing tools 110, FOUP storage 210, and/or the like, via OHT 115. Control device 205 may be separate from or included in portable robotic semiconductor pod loader 105; may control portable robotic semiconductor pod loader 105, OHT 115, and/or FOUP storage 210; and/or the like. FOUP storage 210 may include a mechanism to store FOUPs 120 to be processed by one or more semiconductor processing tools 110. For example, FOUP storage 210 may include a housing that is sized and shaped to receive and store multiple FOUPs 120 until such FOUPs 120 are ready to be provided to one or more semiconductor processing tools 110.

As further shown in FIG. 2A, and by reference number 215, control device 205 may communicate with OHT 115 to provide FOUP 120 on load port 140 of portable robotic semiconductor pod loader 105, and determine receipt of FOUP 120 based on signals received from presence sensors 185 and/or placement sensors 190. For example, control device 205 may communicate with semiconductor processing tool 110 to receive data identifying a particular FOUP 120, stored in FOUP storage 210, that includes semiconductor devices to be processed by semiconductor processing tool 110. Based on the data identifying the particular FOUP 120 (e.g., an identifier tag identifying the particular FOUP 120), control device 205 may instruct OHT 115 to retrieve the particular FOUP 120 from FOUP storage 210 (e.g., based on the identifier tag) and to transport the particular FOUP 120 to load port 140 of portable robotic semiconductor pod loader 105. In some implementations, control device 205 may communicate with portable robotic semiconductor pod loader 105 (e.g., based on signals received from presence sensors 185 and/or placement sensors 190) to identify an available load port 140. When the particular FOUP 120 is received on the available load port 140, control device 205 may receive the signals, from portable robotic semiconductor pod loader 105 (e.g., based on signals from presence sensors 185 and/or placement sensors 190), indicating that the particular FOUP 120 is received on load port 140. Based on receiving the signals, control device 205 may instruct portable robotic semiconductor pod loader 105 to provide the particular FOUP 120 to the staging area of semiconductor processing tool 110. Once the particular FOUP 120 is located at the staging area, semiconductor processing tool 110 may remove the semiconductor devices from the particular FOUP 120 and may process the semiconductor devices. This process may be repeated for other FOUPs 120.

Once the semiconductor devices are processed by semiconductor processing tool 110 and returned to the particular FOUP 120, control device 205 may instruct portable robotic semiconductor pod loader 105 to provide the particular FOUP 120 from the staging area of semiconductor processing tool 110 to load port 140. Control device 205 may also instruct OHT 115 to transport the particular FOUP 120 (e.g., with the processed semiconductor devices) to another portable robotic semiconductor pod loader 105 associated with another semiconductor processing tool 110, to FOUP storage 210, and/or the like.

Figure 2B:
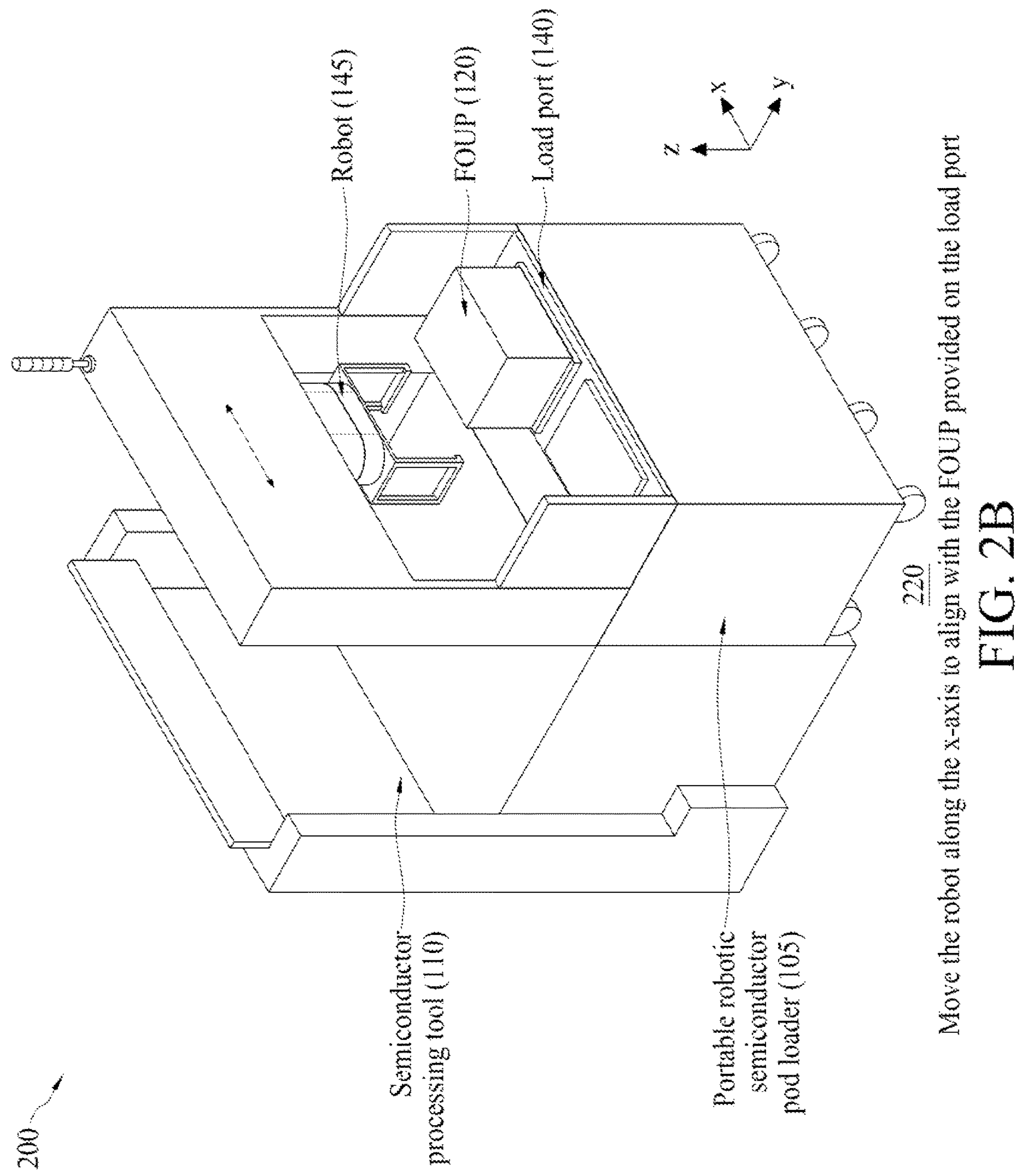

FIG. 2B depicts a time when FOUP 120 is received on load port 140 from OHT 115, as described above in connection with FIG. 2A. As further shown in FIG. 2B, and by reference number 220, portable robotic semiconductor pod loader 105 may move robot 145 along the x-axis to align with FOUP 120 provided on load port 140. For example, portable robotic semiconductor pod loader 105 may utilize the main body and the track (e.g., a belt conveyor system, a sliding rack, or a similar mechanism) to allow robot 145 to move along the x-axis (e.g., the axis parallel to the width of portable robotic semiconductor pod loader 105) until robot 145 is aligned with FOUP 120 provided on load port 140 (e.g., along the x-axis).

Figure 2C:
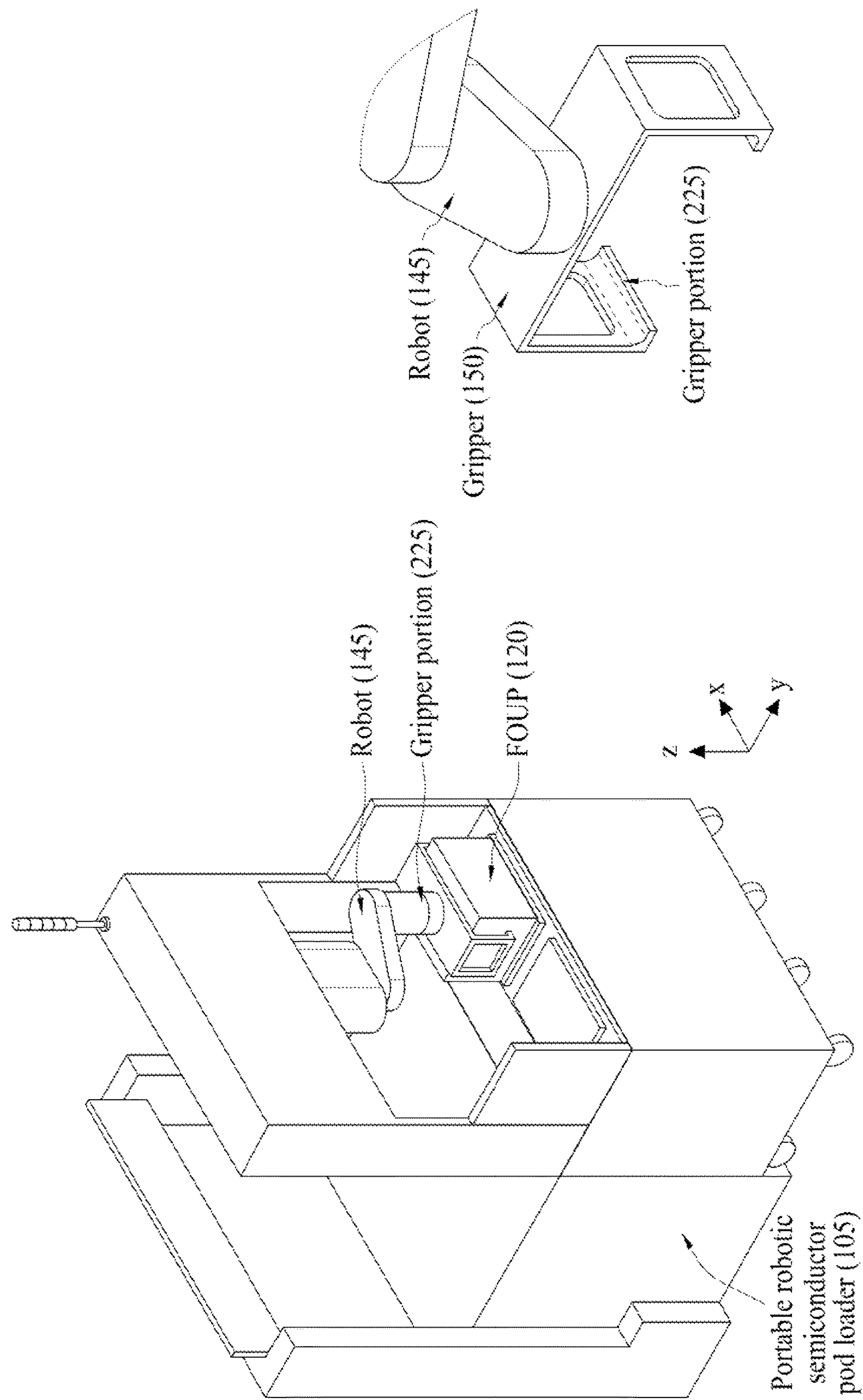

As shown in FIG. 2C, gripper 150 may include a gripper portion 225 that slides into one or more grooves provided in sidewalls of FOUP 120. In some implementations, gripper portion 225 includes a thickness of less than approximately five millimeters, to enable gripper portion 225 to connect with the one or more grooves provided in the sidewalls of FOUP 120 (e.g., so that FOUP 120 may be gripped). The thickness of gripper portion 225 may enable gripper 150 to provide FOUP 120 within the confines of the staging area of semiconductor processing tool 110.

As further shown in FIG. 2C, and by reference number 230, portable robotic semiconductor pod loader 105 may move robot 145 along the y-axis to align robot 145 above FOUP 120 provided on load port 140, may move robot 145 along the z-axis to provide gripper 150 and gripper portion 225 around FOUP 120, and may affix gripper portion 225 to FOUP 120. For example, portable robotic semiconductor pod loader 105 may utilize the articulating robotic arm of robot 145 to move robot 145 and gripper 150 along the y-axis (e.g., the axis parallel to the depth of portable robotic semiconductor pod loader 105) and align robot 145 and gripper 150 above FOUP 120 provided on load port 140. Portable robotic semiconductor pod loader 105 may utilize the ball screw or similar mechanism to lower robot 145 and gripper 150 along the z-axis (e.g., the axis parallel to the height of portable robotic semiconductor pod loader 105) and provide gripper 150 and gripper portion 225 around FOUP 120. Portable robotic semiconductor pod loader 105 may then affix gripper portion 225 to FOUP 120.

Figure 2D:
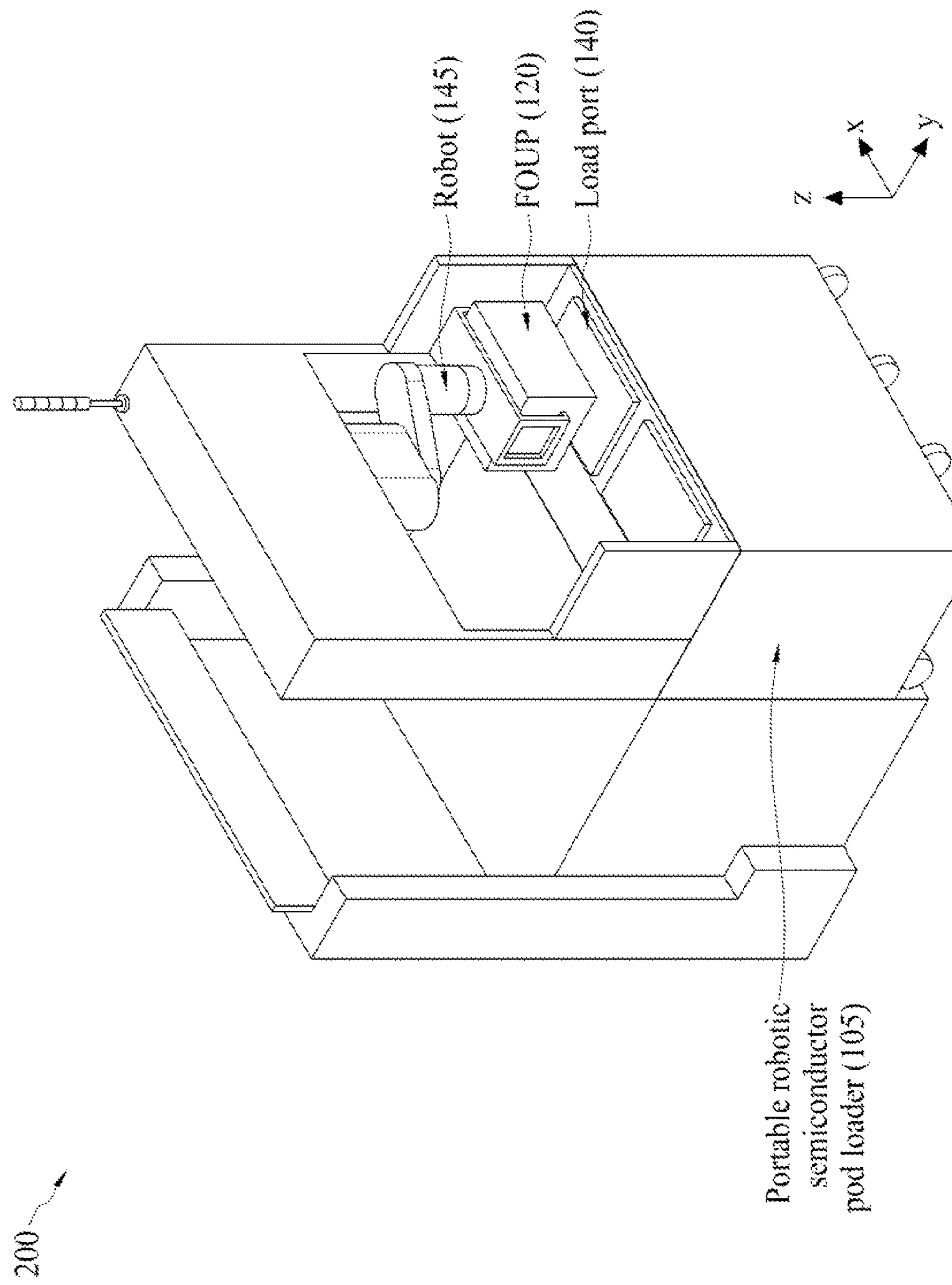

As shown in FIG. 2D, and by reference number 235, portable robotic semiconductor pod loader 105 may move robot 145 upward along the z-axis, after attaching gripper 150 (e.g., gripper portion 225) to FOUP 120, to move FOUP 120 upward away from load port 140. For example, after attaching gripper 150 to FOUP 120, portable robotic semiconductor pod loader 105 may utilize the ball screw or similar mechanism to move robot 145 and gripper 150 upward along the z-axis and move FOUP 120 upward away from load port 140.

Figure 2E:
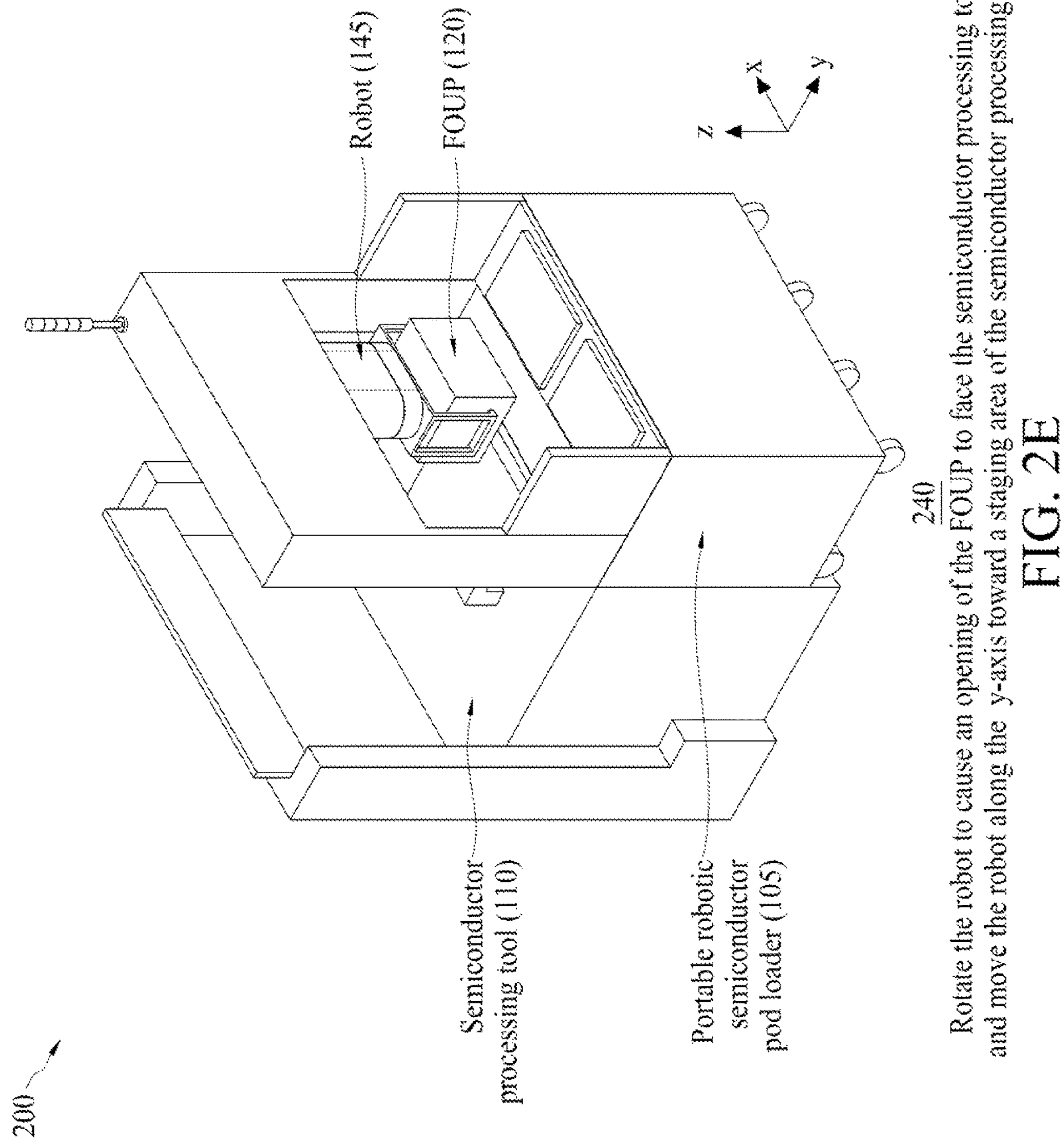

As shown in FIG. 2E, and by reference number 240, portable robotic semiconductor pod loader 105 may rotate robot 145 to cause an opening of FOUP 120 to face semiconductor processing tool 110 and may move robot 145 along the y-axis toward a staging area of semiconductor processing tool 110. For example, portable robotic semiconductor pod loader 105 may utilize the articulating robotic arm of robot 145 to rotate FOUP 120 so that the front opening of FOUP 120 is facing semiconductor processing tool 110. Alternatively, portable robotic semiconductor pod loader 105 may utilize load port 140 to rotate FOUP 120 so that the front opening of FOUP 120 is facing semiconductor processing tool 110. Portable robotic semiconductor pod loader 105 may also utilize the articulating robotic arm of robot 145 to move robot 145 along the y-axis toward the staging area of semiconductor processing tool 110 until FOUP 120 is located above the staging area.

Figure 2F:
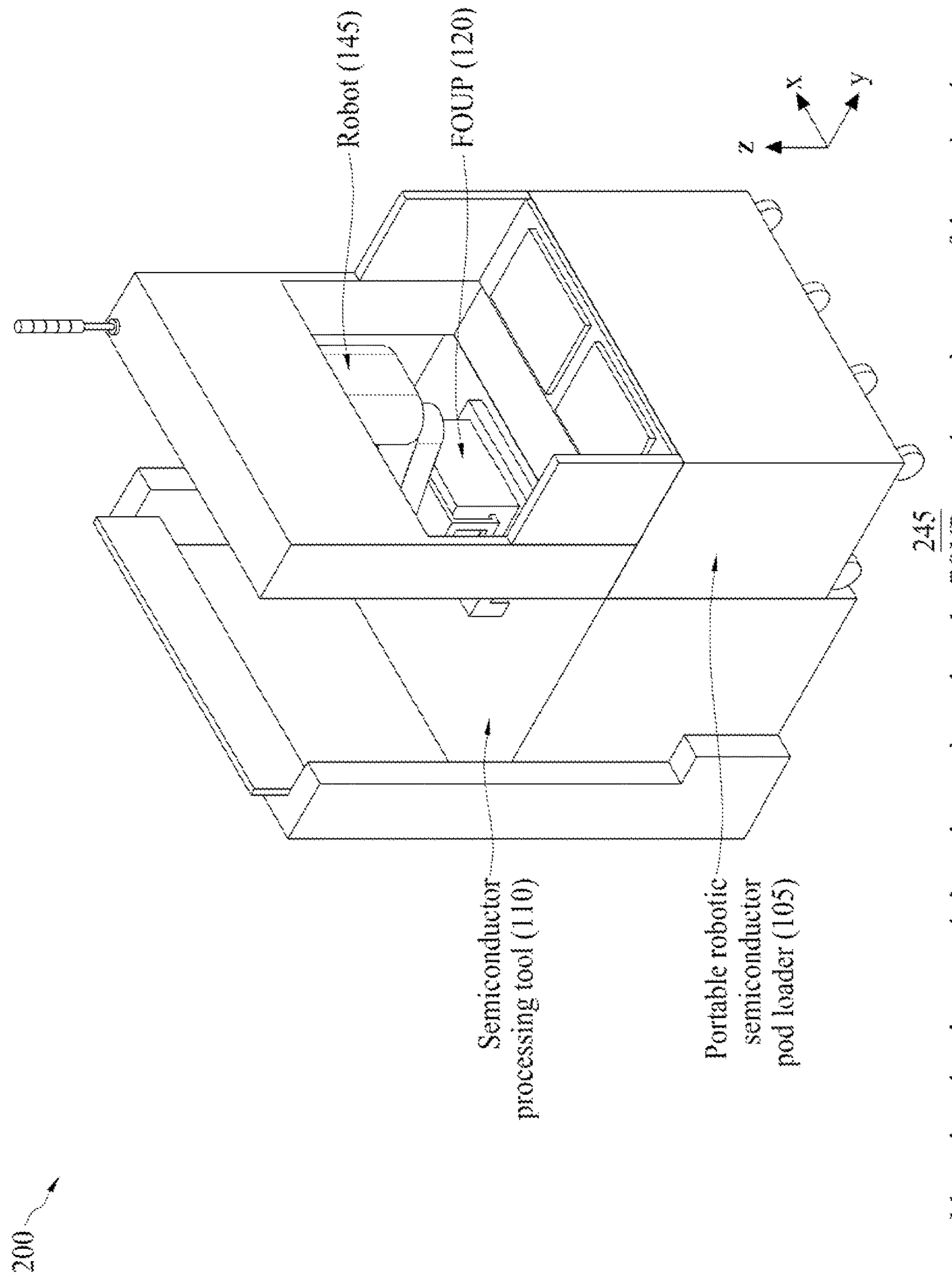

As shown in FIG. 2F, and by reference number 245, portable robotic semiconductor pod loader 105 may move robot 145 downward along the z-axis to place FOUP 120 onto the staging area of semiconductor processing tool 110. For example, after FOUP 120 is located above the staging area, portable robotic semiconductor pod loader 105 may utilize the ball screw or similar mechanism to move robot 145 and gripper 150 downward along the z-axis and move FOUP 120 downward onto the staging area of semiconductor processing tool 110.

Figure 2G:
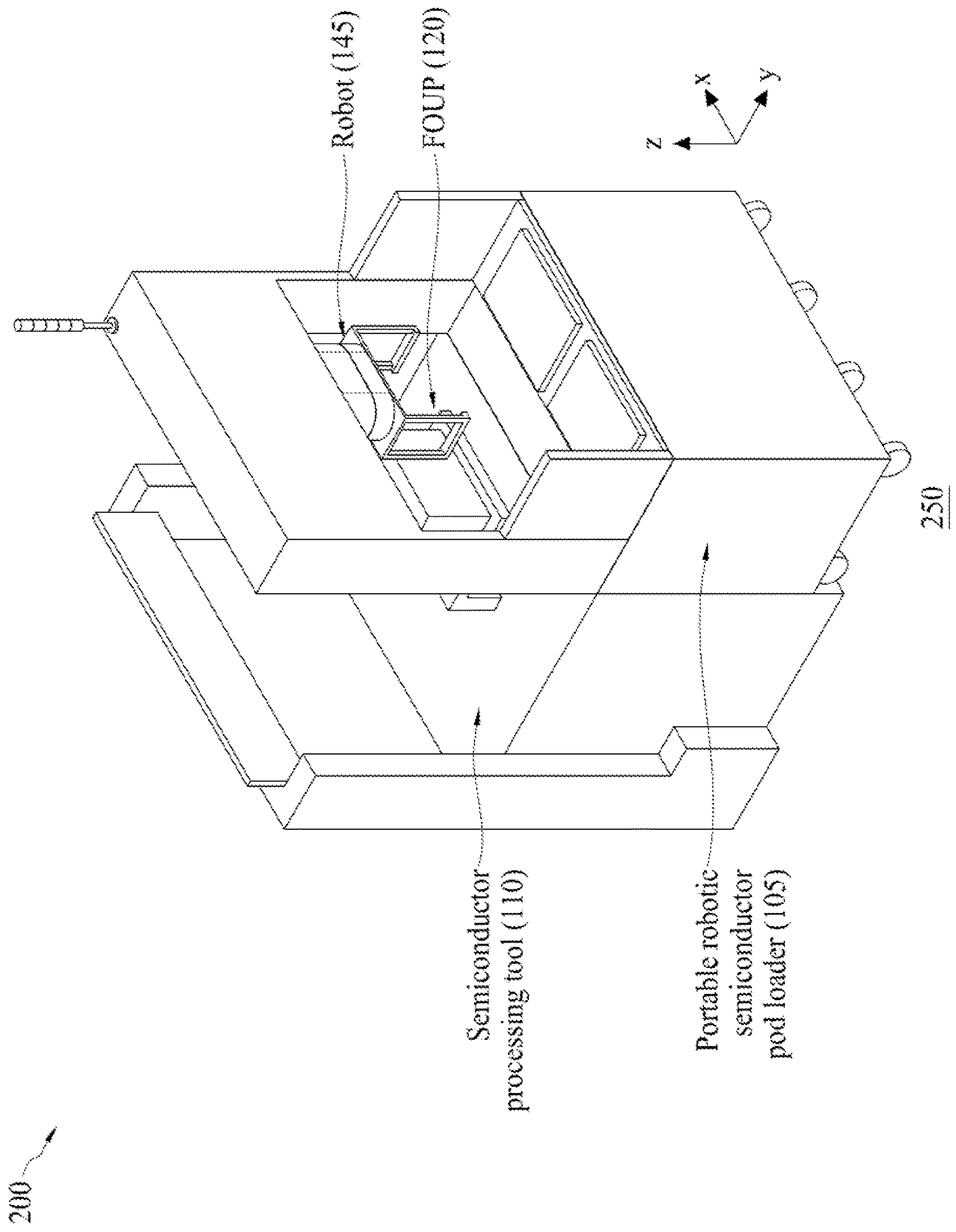

As shown in FIG. 2G, and by reference number 250, portable robotic semiconductor pod loader 105 may cause robot 145 to release FOUP 120 and move robot 145 along the y-axis and away from semiconductor processing tool 110. For example, portable robotic semiconductor pod loader 105 may cause gripper 150 to release FOUP 120 and may utilize the ball screw or similar mechanism to move robot 145 and gripper 150 upward along the z-axis and away from the staging area of semiconductor processing tool 110. Portable robotic semiconductor pod loader 105 may utilize the articulating robotic arm of robot 145 to move robot 145 along the y-axis and away from the staging area of semiconductor processing tool 110.

Once semiconductor processing tool 110 processes the semiconductor devices of FOUP 120 and returns the semiconductor devices to FOUP 120 on the staging area of semiconductor processing tool 110, portable robotic semiconductor pod loader 105 may cause robot 145 to retrieve FOUP 120 from the staging area and return FOUP 120 to an available load port 140 of portable robotic semiconductor pod loader 105. For example, portable robotic semiconductor pod loader 105 may cause gripper 150 to grip FOUP 120 and may utilize the ball screw or similar mechanism to move robot 145, gripper 150, and FOUP 120 upward along the z-axis and away from the staging area of semiconductor processing tool 110. Portable robotic semiconductor pod loader 105 may utilize the articulating robotic arm of robot 145 to move FOUP 120 along the y-axis, away from the staging area of semiconductor processing tool 110, and to load port 140. Portable robotic semiconductor pod loader 105 may utilize the ball screw or similar mechanism to move robot 145, gripper 150, and FOUP 120 downward along the z-axis and toward load port 140, and may cause gripper 150 to release FOUP 120 on load port 140. OHT 115 may retrieve FOUP 120 from load port 140, and may provide FOUP 120 to FOUP storage 210, another semiconductor processing tool 110, and/or the like.

As indicated above, FIGS. 2A-2G are provided merely as one or more examples. Other examples may differ from what is described with regard to FIGS. 2A-2G.

Figure 3:
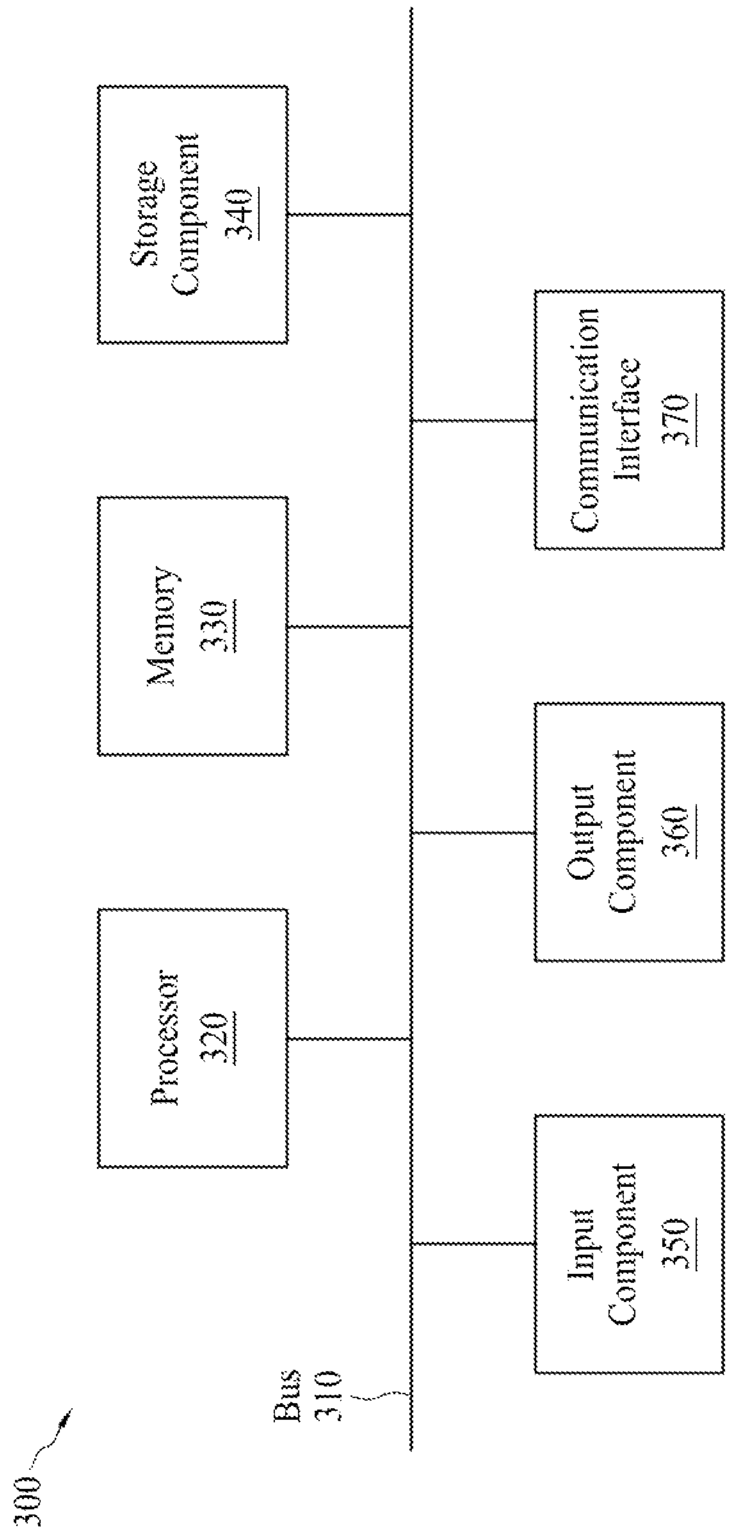
FIG. 3 is a diagram of example components of the portable robotic semiconductor pod loader or a device associated with the portable robotic semiconductor pod loader.

FIG. 3 is a diagram of example components of a device 300, which may correspond to portable robotic semiconductor pod loader 105, semiconductor processing tool 110, OHT 115, and/or control device 205. In some implementations, portable robotic semiconductor pod loader 105, semiconductor processing tool 110, OHT 115, and/or control device 205 may include one or more devices 300 and/or one or more components of device 300. As shown in FIG. 3, device 300 may include a bus 310, a processor 320, a memory 330, a storage component 340, an input component 350, an output component 360, and a communication component 370.

Bus 310 includes a component that enables wired and/or wireless communication among the components of device 300. Processor 320 includes a central processing unit, a graphics processing unit, a microprocessor, a controller, a microcontroller, a digital signal processor, a field-programmable gate array, an application-specific integrated circuit, and/or another type of processing component. Processor 320 is implemented in hardware, firmware, or a combination of hardware and software. In some implementations, processor 320 includes one or more processors capable of being programmed to perform a function. Memory 330 includes a random access memory, a read only memory, and/or another type of memory (e.g., a flash memory, a magnetic memory, and/or an optical memory).

Storage component 340 stores information and/or software related to the operation of device 300. For example, storage component 340 may include a hard disk drive, a magnetic disk drive, an optical disk drive, a solid state disk drive, a compact disc, a digital versatile disc, and/or another type of non-transitory computer-readable medium. Input component 350 enables device 300 to receive input, such as user input and/or sensed inputs. For example, input component 350 may include a touch screen, a keyboard, a keypad, a mouse, a button, a microphone, a switch, a sensor, a global positioning system component, an accelerometer, a gyroscope, an actuator, and/or the like. Output component 360 enables device 300 to provide output, such as via a display, a speaker, and/or one or more light-emitting diodes. Communication component 370 enables device 300 to communicate with other devices, such as via a wired connection and/or a wireless connection. For example, communication component 370 may include a receiver, a transmitter, a transceiver, a modem, a network interface card, an antenna, and/or the like.

Device 300 may perform one or more processes described herein. For example, a non-transitory computer-readable medium (e.g., memory 330 and/or storage component 340) may store a set of instructions (e.g., one or more instructions, code, software code, program code, and/or the like) for execution by processor 320. Processor 320 may execute the set of instructions to perform one or more processes described herein. In some implementations, execution of the set of instructions, by one or more processors 320, causes the one or more processors 320 and/or the device 300 to perform one or more processes described herein. In some implementations, hardwired circuitry may be used instead of or in combination with the instructions to perform one or more processes described herein. Thus, implementations described herein are not limited to any specific combination of hardware circuitry and software.

The number and arrangement of components shown in FIG. 3 are provided as an example. Device 300 may include additional components, fewer components, different components, or differently arranged components than those shown in FIG. 3. Additionally, or alternatively, a set of components (e.g., one or more components) of device 300 may perform one or more functions described as being performed by another set of components of device 300.

Figure 4:
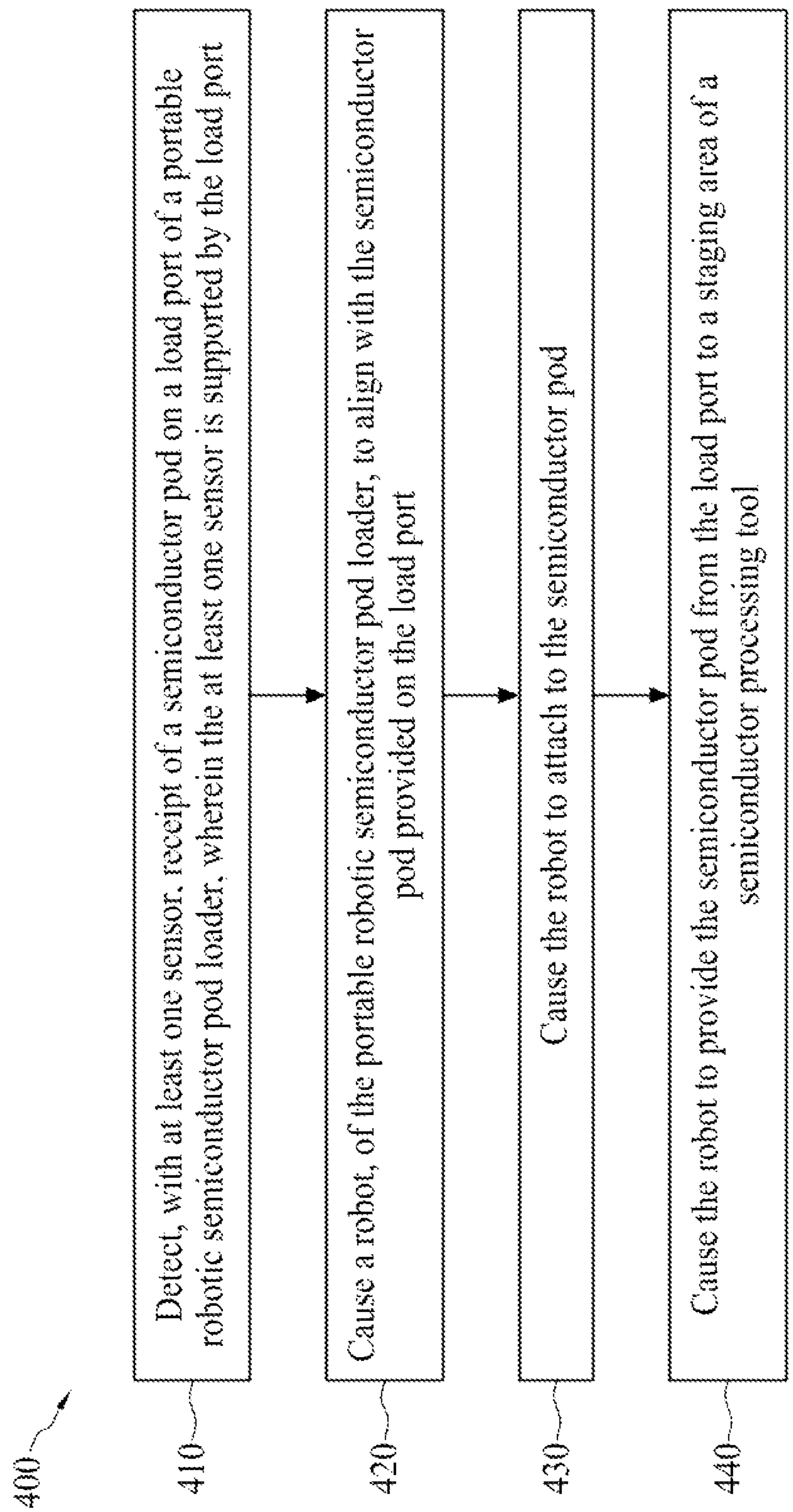
FIG. 4 is a flowchart of an example process for handling semiconductor pods with the portable robotic semiconductor pod loader.

FIG. 4 is a flow chart of an example process 400 for handling semiconductor pods with a portable robotic semiconductor pod loader. In some implementations, one or more process blocks of FIG. 4 may be performed by a portable robotic semiconductor pod loader (e.g., portable robotic semiconductor pod loader 105). In some implementations, one or more process blocks of FIG. 4 may be performed by another device or a group of devices separate from or including the portable robotic semiconductor pod loader, such as an OHT (e.g., OHT 115), a control device (e.g., control device 205), and/or the like. Additionally, or alternatively, one or more process blocks of FIG. 4 may be performed by one or more components of device 300, such as processor 320, memory 330, storage component 340, input component 350, output component 360, communication component 370, and/or the like.

As shown in FIG. 4, process 400 may include detecting, with at least one sensor, receipt of a semiconductor pod on a load port of a portable robotic semiconductor pod loader, wherein the at least one sensor is supported by the load port (block 410). For example, the portable robotic semiconductor pod loader may detect, with at least one sensor, receipt of a semiconductor pod on a load port of the portable robotic semiconductor pod loader, as described above. In some implementations, the at least one sensor is supported by the load port.

As further shown in FIG. 4, process 400 may include causing a robot, of the portable robotic semiconductor pod loader, to align with the semiconductor pod provided on the load port (block 420). For example, the portable robotic semiconductor pod loader may cause a robot, of the portable robotic semiconductor pod loader, to align with the semiconductor pod provided on the load port, as described above.

As further shown in FIG. 4, process 400 may include causing the robot to attach to the semiconductor pod (block 430). For example, the portable robotic semiconductor pod loader may cause the robot to attach to the semiconductor pod, as described above.

As further shown in FIG. 4, process 400 may include causing the robot to provide the semiconductor pod from the load port to a staging area of a semiconductor processing tool (block 440). For example, the portable robotic semiconductor pod loader may cause the robot to provide the semiconductor pod from the load port to a staging area of a semiconductor processing tool, as described above.

Process 400 may include additional implementations, such as any single implementation or any combination of implementations described below and/or in connection with one or more other processes described elsewhere herein.

In a first implementation, process 400 includes receiving, from an overhead hoist transportation system, the semiconductor pod on the load port to permit the at least one sensor to detect receipt of the semiconductor pod.

In a second implementation, alone or in combination with the first implementation, causing the robot to align with the semiconductor pod includes causing the robot to align with the semiconductor pod along a first axis that is parallel with a width of the portable robotic semiconductor pod loader, and causing the robot to align with the semiconductor pod along a second axis that is perpendicular to the width of the portable robotic semiconductor pod loader, wherein the robot is provided above the semiconductor pod when the robot is aligned with the semiconductor pod along the first axis and the second axis.

In a third implementation, alone or in combination with one or more of the first and second implementations, causing the robot to attach to the semiconductor pod includes causing the robot to move, downward and toward the load port, along an axis that is perpendicular to a top surface of the load port, causing a gripper portion of the robot to attach to the semiconductor pod, and causing the robot to move, upward and away from the load port, along the axis.

In a fourth implementation, alone or in combination with one or more of the first through third implementations, causing the robot to provide the semiconductor pod from the load port to the staging area of the semiconductor processing tool includes causing the robot to move the semiconductor pod along a first axis, that is perpendicular to a width of the portable robotic semiconductor pod loader, until the semiconductor pod is located above the staging area; causing the robot to move the semiconductor pod, downward and toward the staging area, along a second axis that is perpendicular to a top surface of the staging area; causing a gripper portion of the robot to release the semiconductor pod on the staging area; and causing the robot to move, upward and away from the staging area, along the second axis.

In a fifth implementation, alone or in combination with one or more of the first through fourth implementations, causing the robot to provide the semiconductor pod from the load port to the staging area of the semiconductor processing tool includes causing the robot to remove the semiconductor pod from the load port, causing the robot to rotate the semiconductor pod to orient an opening of the semiconductor pod with the staging area of the semiconductor processing tool, and causing the robot to provide the rotated semiconductor pod to the staging area of the semiconductor processing tool.

In a sixth implementation, alone or in combination with one or more of the first through fifth implementations, process 400 includes providing, to a control device, a signal indicating that the semiconductor pod was provided to the staging area of the semiconductor processing tool.

In a seventh implementation, alone or in combination with one or more of the first through sixth implementations, a width of the portable robotic semiconductor pod loader is approximately equivalent to or greater than a width of the semiconductor processing tool.

In an eighth implementation, alone or in combination with one or more of the first through seventh implementations, the load port is configured to rotate the semiconductor pod to orient an opening of the semiconductor pod with the staging area of the semiconductor processing tool.

In a ninth implementation, alone or in combination with one or more of the first through eighth implementations, the at least one sensor includes one of at least one mechanical placement sensor to detect the presence or placement of the semiconductor pod on the load port, or at least one optical sensor to detect the presence or placement of the semiconductor pod on the load port.

In a tenth implementation, alone or in combination with one or more of the first through ninth implementations, the robot is configured to rotate the semiconductor pod to orient an opening of the semiconductor pod with the staging area of the semiconductor processing tool; move the semiconductor pod along a first axis that is parallel with a width of the portable robotic semiconductor pod loader; move the semiconductor pod, to or from the staging area of the semiconductor processing tool, along a second axis that is perpendicular to the width of the portable robotic semiconductor pod loader; move the semiconductor pod, towards or away from the load port, along a third axis that is perpendicular to a top surface of the load port; or a combination thereof.

In an eleventh implementation, alone or in combination with one or more of the first through tenth implementations, the robot includes a gripper portion to attach to the semiconductor pod and to enable the robot to lift and provide the semiconductor pod from the load port to the staging area of the semiconductor processing tool.

In a twelfth implementation, alone or in combination with one or more of the first through eleventh implementations, the robot includes a belt conveyor system to move the semiconductor pod along a first axis, a robotic arm to rotate the semiconductor pod and to move the semiconductor pod along a second axis, and a ball screw to move the semiconductor pod along a third axis.

In a thirteenth implementation, alone or in combination with one or more of the first through twelfth implementations, the robot is configured to align with the semiconductor pod along a first axis that is parallel with a width of the portable robotic semiconductor pod loader; align with the semiconductor pod along a second axis that is perpendicular to the width of the portable robotic semiconductor pod loader, wherein the robot is provided above the semiconductor pod when the robot is aligned with the semiconductor pod along the first axis and the second axis; move, downward and toward the one of the plurality of load ports, along a third axis that is perpendicular to a top surface of the least one of the plurality of load ports; cause a gripper portion of the robot to attach to the semiconductor pod; move, upward away from the load port, along the third axis; and move the semiconductor pod along the second axis until the semiconductor pod is located at the staging area.

In a fourteenth implementation, alone or in combination with one or more of the first through thirteenth implementations, the robot is configured to remove the semiconductor pod from one of a plurality of load ports, rotate the semiconductor pod to orient an opening of the semiconductor pod with the staging area of the semiconductor processing tool, and provide the semiconductor pod, after rotating the semiconductor pod, to the staging area of the semiconductor processing tool.

In a fifteenth implementation, alone or in combination with one or more of the first through fourteenth implementations, the robot includes a gripper portion, with a thickness of less than approximately five millimeters, to connect with one or more grooves provided in the semiconductor pod.

In a sixteenth implementation, alone or in combination with one or more of the first through fifteenth implementations, one of a plurality of load ports is configured to rotate the semiconductor pod to orient an opening of the semiconductor pod with the staging area of the semiconductor processing tool.

Although FIG. 4 shows example blocks of process 400, in some implementations, process 400 may include additional blocks, fewer blocks, different blocks, or differently arranged blocks than those depicted in FIG. 4. Additionally, or alternatively, two or more of the blocks of process 400 may be performed in parallel.

In this way, portable robotic semiconductor pod loader 105 may automatically load and unload FOUPs 120 to and from staging areas of semiconductor processing tools 110. For example, portable robotic semiconductor pod loader 105 may receive FOUP 120 from OHT 115, may orient FOUP 120, and may provide FOUP 120 to the staging area of semiconductor processing tool 110. Thus, portable robotic semiconductor pod loader 105 may eliminate manual loading and unloading of FOUPs 120 at staging areas of semiconductor processing tools 110, which may prevent interruptions in the process flow of semiconductor processing tools 110.

As described in greater detail above, some implementations described herein provide a portable robotic semiconductor pod loader. The portable robotic semiconductor pod loader may include a base housing, a top housing provided above and supported by the base housing, and a load port supported by the base housing. The load port may receive a semiconductor pod from an overhead automated material handling system, and at least one sensor may be supported by the load port. The at least one sensor may detect a presence or placement of the semiconductor pod on the load port. The portable robotic semiconductor pod loader may include a robot supported by the top housing, wherein the robot may provide the semiconductor pod from the load port to a staging area of a semiconductor processing tool.

As described in greater detail above, some implementations described herein provide a method performed by a portable robotic semiconductor pod loader. The method may include detecting, with at least one sensor, receipt of a semiconductor pod on a load port of the portable robotic semiconductor pod loader, wherein the at least one sensor is supported by the load port. The method may include causing a robot, of the portable robotic semiconductor pod loader, to align with the semiconductor pod provided on the load port, and causing the robot to attach to the semiconductor pod. The method may include causing the robot to provide the semiconductor pod from the load port to a staging area of a semiconductor processing tool.

As described in greater detail above, some implementations described herein provide a portable robotic semiconductor pod loader. The portable robotic semiconductor pod loader may include a housing that is movable to position the portable robotic semiconductor pod loader adjacent to a staging area of a semiconductor processing tool, and a plurality of load ports supported by the housing, wherein one of the plurality of load ports may receive a semiconductor pod from an overhead automated material handling system. The portable robotic semiconductor pod loader may include at least two sensors supported by the one of the plurality of load ports, wherein the at least two sensors may detect a presence or placement of the semiconductor pod on the one of the plurality of load ports. The portable robotic semiconductor pod loader may include a robot supported by the housing, wherein the robot may provide the semiconductor pod from the one of the plurality of load ports to the staging area of the semiconductor processing tool.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that those skilled in the art may make various changes, substitutions, and alterations herein without departing from the spirit and scope of the present disclosure.

What is claimed is:

1. A portable robotic semiconductor pod loader, comprising:

a base housing;

a top housing provided above and supported by the base housing;

a load port supported by the base housing and configured to receive a semiconductor pod from an overhead automated material handling system, wherein the load port is configured to:

rotate the semiconductor pod to orient an opening of the semiconductor pod with a staging area of a semiconductor processing tool, and support at least one sensor configured to detect a presence or placement of the semiconductor pod on the load port;

a robot supported by the top housing, wherein the robot is configured to provide the semiconductor pod from the load port to the staging area of the semiconductor processing tool; and a set of powered wheels supporting the base housing and enabling the base housing to autonomously or semi-autonomously move in an unbounded manner in three or more directions of a plane.

2. The portable robotic semiconductor pod loader of claim 1, wherein a width of the portable robotic semiconductor pod loader is approximately equivalent to or greater than a width of the semiconductor processing tool.

3. The portable robotic semiconductor pod loader of claim 1, wherein the at least one sensor comprises:

at least one optical sensor to detect the presence or placement of the semiconductor pod on the load port.

4. The portable robotic semiconductor pod loader of claim 1, wherein the robot is configured to:

move the semiconductor pod along a first axis that is parallel with a width of the portable robotic semiconductor pod loader, move the semiconductor pod, to or from the staging area of the semiconductor processing tool, along a second axis that is perpendicular to the width of the portable robotic semiconductor pod loader, move the semiconductor pod, towards or away from the load port, along a third axis that is perpendicular to a top surface of the load port, or a combination thereof.

5. The portable robotic semiconductor pod loader of claim 1, wherein the robot includes a gripper portion to attach to the semiconductor pod and to enable the robot to lift and provide the semiconductor pod from the load port to the staging area of the semiconductor processing tool.

6. The portable robotic semiconductor pod loader of claim 5, wherein the gripper portion has a rotational range of motion to enable the gripper portion to rotate the semiconductor pod so that a front opening of the semiconductor pod is facing an entrance of the semiconductor processing tool.

7. The portable robotic semiconductor pod loader of claim 1, wherein the robot comprises:

a belt conveyor system to move the semiconductor pod along a first axis;

a robotic arm to rotate the semiconductor pod and to move the semiconductor pod along a second axis; and a ball screw to move the semiconductor pod along a third axis.

8. The portable robotic semiconductor pod loader of claim 1, wherein:

the robot includes a gripper portion, the top housing includes a monitor, and the top housing is constructed of materials configured to provide rigidity to support weights of the robot, the gripper portion, and the monitor.

9. A method, comprising:

detecting, with at least one sensor, receipt of a semiconductor pod on a load port of a portable robotic semiconductor pod loader, wherein the portable robotic semiconductor pod loader is supported by a set of powered wheels that enable the portable robotic semiconductor pod loader to autonomously or semi-autonomously move in an unbounded manner in three or more directions of a plane, and wherein the load port is configured to rotate the semiconductor pod to orient an opening of the semiconductor pod with a staging area of a semiconductor processing tool and support the at least one sensor;

causing a robot, of the portable robotic semiconductor pod loader, to align with the semiconductor pod provided on the load port;

causing the robot to attach to the semiconductor pod; and causing the robot to provide the semiconductor pod from the load port to the staging area of the semiconductor processing tool.

10. The method of claim 9, further comprising:

receiving, from an overhead hoist transportation system, the semiconductor pod on the load port to permit the at least one sensor to detect receipt of the semiconductor pod.

11. The method of claim 9, wherein causing the robot to align with the semiconductor pod comprises:

causing the robot to align with the semiconductor pod along a first axis that is parallel with a width of the portable robotic semiconductor pod loader; and causing the robot to align with the semiconductor pod along a second axis that is perpendicular to the width of the portable robotic semiconductor pod loader, wherein the robot is provided above the semiconductor pod when the robot is aligned with the semiconductor pod along the first axis and the second axis.

12. The method of claim 9, wherein causing the robot to attach to the semiconductor pod comprises:

causing the robot to move, downward and toward the load port, along an axis that is perpendicular to a top surface of the load port;

causing a gripper portion of the robot to attach to the semiconductor pod; and causing the robot to move, upward and away from the load port, along the axis.

13. The method of claim 9, wherein causing the robot to provide the semiconductor pod from the load port to the staging area of the semiconductor processing tool comprises:

causing the robot to move the semiconductor pod along a first axis, that is perpendicular to a width of the portable robotic semiconductor pod loader, until the semiconductor pod is located above the staging area;

causing the robot to move the semiconductor pod, downward and toward the staging area, along a second axis that is perpendicular to a top surface of the staging area;

causing a gripper portion of the robot to release the semiconductor pod on the staging area; and causing the robot to move, upward and away from the staging area, along the second axis.

14. The method of claim 9, wherein causing the robot to provide the semiconductor pod from the load port to the staging area of the semiconductor processing tool comprises:

causing the robot to remove the semiconductor pod from the load port;

causing the robot to rotate the semiconductor pod to orient the opening of the semiconductor pod with the staging area of the semiconductor processing tool; and causing the robot to provide the rotated semiconductor pod to the staging area of the semiconductor processing tool.

15. The method of claim 9, further comprising:

providing, to a control device, a signal indicating that the semiconductor pod was provided to the staging area of the semiconductor processing tool.

16. A portable robotic semiconductor pod loader, comprising:

a housing that is movable to position the portable robotic semiconductor pod loader adjacent to a staging area of a semiconductor processing tool, wherein a set of powered wheels supporting the housing enables the housing to autonomously or semi-autonomously move in an unbounded manner in three or more directions of a plane;

a plurality of load ports supported by the housing, wherein one of the plurality of load ports is configured to:

receive a semiconductor pod from an overhead automated material handling system, rotate the semiconductor pod to orient an opening of the semiconductor pod with the staging area of the semiconductor processing tool, and support at least two sensors that are configured to detect a presence or placement of the semiconductor pod on the one of the plurality of load ports; and a robot supported by the housing, wherein the robot is configured to provide the semiconductor pod from the one of the plurality of load ports to the staging area of the semiconductor processing tool.

17. The portable robotic semiconductor pod loader of claim 16, wherein the at least two sensors comprise:

at least one placement sensor to detect the placement of the semiconductor pod on the one of the plurality of load ports, and at least one presence sensor to detect the presence of the semiconductor pod on the one of the plurality of load ports.

18. The portable robotic semiconductor pod loader of claim 16, wherein the robot, when providing the semiconductor pod from the one of the plurality of load ports to the staging area, is configured to:

align with the semiconductor pod along a first axis that is parallel with a width of the portable robotic semiconductor pod loader, align with the semiconductor pod along a second axis that is perpendicular to the width of the portable robotic semiconductor pod loader, wherein the robot is provided above the semiconductor pod when the robot is aligned with the semiconductor pod along the first axis and the second axis, move, downward and toward the one of the plurality of load ports, along a third axis that is perpendicular to a top surface of the one of the plurality of load ports, cause a gripper portion of the robot to attach to the semiconductor pod, move, upward away from the one of the plurality of load ports, along the third axis, and move the semiconductor pod along the second axis until the semiconductor pod is located at the staging area.

19. The portable robotic semiconductor pod loader of claim 16, wherein the robot, when providing the semiconductor pod from the one of the plurality of load ports to the staging area, is configured to:

remove the semiconductor pod from the one of the plurality of load ports, rotate the semiconductor pod to orient the opening of the semiconductor pod with the staging area of the semiconductor processing tool, and provide the semiconductor pod, after rotating the semiconductor pod, to the staging area of the semiconductor processing tool.

20. The portable robotic semiconductor pod loader of claim 16, wherein the robot includes a gripper portion, with a thickness of less than approximately five millimeters, to connect with one or more grooves provided in the semiconductor pod.

* * * * *